United States Patent
Abel

(12) United States Patent    (10) Patent No.: US 7,116,178 B2
Abel    (45) Date of Patent: Oct. 3, 2006

(54) VOLTAGE-CONTROLLED OSCILLATOR WITH GAIN PROPORTIONAL TO OPERATING FREQUENCY

(75) Inventor: Christopher J. Abel, Coplay, PA (US)

(73) Assignee: Agere Systems Inc., Allentown, PA (US)

( * ) Notice: Subject to any disclaimer, the term of this patent is extended or adjusted under 35 U.S.C. 154(b) by 30 days.

(21) Appl. No.: 11/071,707

(22) Filed: Mar. 3, 2005

(65) Prior Publication Data

US 2006/0197609 A1    Sep. 7, 2006

(51) Int. Cl.
*H03L 7/08* (2006.01)
*H03L 7/099* (2006.01)

(52) U.S. Cl. .............. 331/17; 331/34; 331/177 R
(58) Field of Classification Search .............. 331/1 A, 331/17, 18, 25, 34, 177 R
See application file for complete search history.

(56) References Cited

U.S. PATENT DOCUMENTS

| | | |
|---|---|---|
| 5,708,396 A | 1/1998 | Mizuno |
| 5,786,733 A | 7/1998 | Yamaguchi |
| 5,787,134 A * | 7/1998 | Kovacs ........................ 375/376 |
| 6,114,820 A | 9/2000 | Nishigaya |
| 6,552,618 B1 | 4/2003 | Nelson et al. |

* cited by examiner

*Primary Examiner*—David Mis

(57) ABSTRACT

Embodiments of the invention include a voltage-controlled oscillator (VCO) circuit in which the gain of the VCO is proportional to the output or operating frequency of the VCO. The VCO circuit includes a voltage-controlled oscillator, a current scaling block, and a summing node. The summing node couples a VCO control current and a VCO reference current into the current scaling block. The current scaling block scales the sum of the currents by a scaling factor. The output of the current scaling block, which is coupled to the input of the VCO, provides a bias current to the VCO, which bias current adjusts the oscillation frequency of the oscillator. The VCO control current and the VCO reference current are scaled by the same scaling factor, thus allowing the gain of the VCO to be proportional to but not dependent on the output frequency of the VCO.

24 Claims, 1 Drawing Sheet

VOLTAGE-CONTROLLED OSCILLATOR WITH GAIN PROPORTIONAL TO OPERATING FREQUENCY

BACKGROUND OF THE INVENTION

1. Field of the Invention

The invention relates to voltage-controlled oscillators. More particularly, the invention relates to a voltage-controlled oscillator, suitable for use in phase-lock loop circuits and other circuits, whose gain is proportional to its operating frequency.

2. Description of the Related Art

A voltage-controlled oscillator (VCO) is a device that generates a periodic output signal whose frequency is a function of the VCO input voltage. The VCO has a characteristic gain, which often is expressed as a ratio of the VCO output frequency to the VCO input voltage. Stated another way, the VCO gain is the slope of an operating curve or set of operating curves of the VCO, where the x-axis is VCO input voltage and the Y-axis is VCO output frequency.

Voltage-controlled oscillators are used in many circuits, including phase-lock loop (PLL) circuits. A PLL circuit is a circuit that generates a periodic output signal that has a constant phase relationship with a periodic input signal. PLL circuits are used in many types of measurement, electromechanical control, microprocessor and communication applications.

Typically, a conventional PLL circuit includes a phase/frequency detector (PFD), a filter and a voltage-controlled oscillator (VCO). The PFD measures differences in phase between an incoming signal and a feedback signal from the VCO. Any detected differences generate an error signal, which is filtered and then supplied to the VCO. The VCO uses the error signal to reduce the frequency difference between the feedback signal and the incoming signal.

U.S. Pat. No. 6,114,920 discloses a PLL circuit with an oscillator architecture that includes autotrim. Autotrim is a feature or procedure that calibrates the center frequency of the VCO during a power-up or reset of the PLL circuit. This autotrim feature allows the oscillator to operate across a relatively wide output frequency range while still maintaining a relatively low VCO gain.

However, in the VCO architecture in the PLL circuit disclosed in U.S. Pat. No. 6,114,920, the VCO gain is not proportional to the operating frequency of the VCO. Thus, such VCO architecture may not be suitable for applications in which the VCO gain needs to be proportional to the operating frequency, e.g., 10,000 ppm/V (ppm/V=percent parts per million per unit voltage), while the VCO still needs to be able to operate across a relatively wide range of operating frequencies.

Accordingly, it would be desirable to have available a VCO in which the gain of the VCO is proportional to the operating frequency of the VCO.

SUMMARY OF THE INVENTION

The invention is embodied in a voltage-controlled oscillator (VCO) circuit in which the gain of the oscillator is proportional to the output or operating frequency of the oscillator. The VCO circuit includes a voltage-controlled oscillator, a current scaling block, and a summing node. The summing node couples a VCO control current and a VCO reference current into the current scaling block. The current scaling block scales the sum of the currents by a scaling factor. The output of the current scaling block, which is coupled to the input of the VCO, provides a bias current to the VCO, which bias current adjusts the oscillation frequency of the oscillator. In the inventive VCO circuit, the VCO control current and the VCO reference current are scaled by the same scaling factor, thus allowing the gain of the VCO to be proportional to but not dependent on the output frequency of the VCO.

DETAILED DESCRIPTION OF EXEMPLARY EMBODIMENTS

Figure 1:
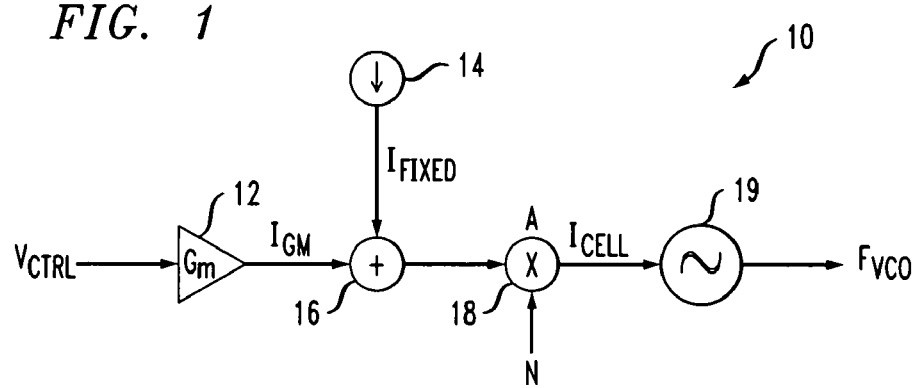
FIG. 1 is a simplified schematic diagram of a conventional phase-lock loop (PLL) circuit.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Referring now to FIG. 1, shown is a simplified schematic diagram of a conventional phase-lock loop (PLL) circuit 10. As discussed previously herein, a PLL circuit is a circuit that generates a periodic output signal that has a constant phase relationship with respect to a periodic input signal. The PLL circuit 10 includes a phase/frequency detector (PFD) 12, a charge pump 14, a loop filter 16, and a voltage-controlled oscillator (VCO) 18.

The PFD 12 compares the phase of an input signal $F_{IN}$ to the phase of a feedback signal $F_{FB}$ and generates an error signal having a sign and magnitude indicative of the phase difference between the two signals. The charge pump 14 generates an amount of charge proportional to the error signal and, depending on the sign of the error signal, either adds or subtracts the charge to the loop filter 16. The voltage from the loop filter 16, $V_{LF}$, is applied to the VCO 18.

The VCO 18 generates a periodic output or operating signal, $F_{VCO}$, whose frequency is a function of the VCO input voltage $V_{LF}$. The VCO output signal $F_{VCO}$, which also is the output signal of the PLL circuit 10, is used to generate the feedback signal $F_{FB}$ to the PFD 12. The feedback signal $F_{FB}$ and/or the input signal $F_{IN}$ may be divided using optional divider circuits (not shown) if the feedback signal is a fraction or a multiple of the input signal. A feedback path (shown generally as 19) causes the steady-state output of the PLL circuit 10, $F_{VCO}$, to have a fixed phase relationship with the input signal $F_{IN}$.

One type of voltage-controlled oscillator is a ring oscillator. In general, ring oscillators typically comprise an odd number of inverters (stages) in a positive feedback configuration. In such ring oscillators, the output or oscillation frequency ($F_{VCO}$) is proportional to 1/RC, where R and C are the effective load resistance and capacitance, respectively, of each stage. In many ring oscillators, e.g., complementary metal oxide semiconductor (CMOS) ring oscillators, the oscillation frequency is controlled by changing the effective load resistance of the oscillator, $R_{LOAD}$. Typically, the load resistance $R_{LOAD}$ is equal to $1/g_M$, where $g_M$ is the transconductance of the oscillator.

Also, the oscillation frequency can be tuned by adjusting the bias current, $I_{CELL}$, of the oscillator. It is known that the oscillation frequency is proportional to the transconductance of the oscillator $g_M$ divided by C (the effective capacitance of the oscillator), which is equal to the square root of $2KI_{CELL}$ divided by C, where K is the gain of the oscillator. That is, $$F_{VCO} \propto \frac{g_M}{C} = \frac{\sqrt{2KI_{CELL}}}{C}$$

VCOs typically are designed for operation across a relatively wide range of operating frequencies. As such, VCOs often are designed with a plurality of operating curves (i.e., output frequency as a function of input voltage). Typically, a special digital control input N is used to select one of the operating curves. The process of selecting one of the VCO operating curves is called trimming.

In U.S. Pat. No. 6,114,920, an autotrim feature uses logic to automatically select an appropriate trim setting for the circuit in which the VCO is used. In particular, the autotrim logic includes a counter or state machine to apply different trim settings to the VCO to select different operating curves for the VCO until an appropriate operating curve for the particular PLL application is found.

As discussed previously herein, with conventional VCOs, including the VCO disclosed in the PLL circuit in U.S. Pat. No. 6,114,920, the VCO gain is not proportional to the operating frequency of the VCO. Such characteristic is unsuitable for applications in which it is desired that the VCO gain be proportional to its operating frequency. However, the VCO still needs to be able to operate across a relatively wide range of operating frequencies.

Figure 2:
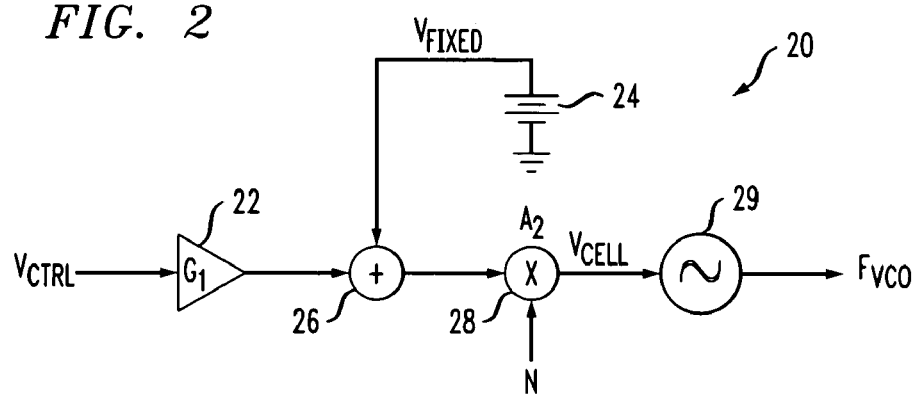
FIG. 2 is a simplified schematic diagram of a voltage-controlled oscillator circuit according to embodiments of the invention.

Embodiments of the invention include a voltage-controlled oscillator whose gain is proportional to its operating frequency, across a relatively wide range of operating frequencies. Referring now to FIG. 2, shown is a simplified schematic diagram of a voltage-controlled oscillator (VCO) 20 according to embodiments of the invention. The VCO 20 includes a voltage to current (V/I) converter 22, a reference current source 24, a summing node 26, a current scaling block 28, and a local oscillator 29.

The V/I converter 22 has an input voltage $V_{CTRL}$, which is the control voltage of the VCO 20. The output of the V/I converter 22 is the VCO control current $I_{GM}$, which is equal to $V_{CTRL} \times G_M$, where $G_M$ is the _____ of the V/I converter 22 and is equal to the inverse of the effective resistance of the V/I converter 22.

The reference current source 24 supplies a fixed current $I_{FIXED}$ to the summing node 26, as shown. According to embodiments of the invention, the VCO control current $I_{GM}$ also is coupled to the summing node 26. The summing node 26 supplies the sum of the two currents to the current scaling block 28.

The current scaling block 28, which has a programmable gain or scaling factor A, scales the current input thereto by the scaling factor. Thus, the output of the current scaling block 28, which is the bias current to the local oscillator 29, $I_{CELL}$, is equal to $A \times (I_{FIXED} + I_{GM})$, or $A \times (I_{FIXED} + G_M \times V_{CTRL})$. That is, $$I_{CELL} = A(I_{FIXED} + I_{GM}) = A(I_{FIXED} + G_M V_{CTRL})$$

The programmable gain A of the current scaling block 28 is controlled by a control input N. The control input N is any suitable control input for controlling the current scaling block 28. For example, the control input N can be a coarse frequency control. Alternatively, the control input N can be the portion of autotrim logic (not shown) that selects an appropriate oscillator operating curve, e.g., as discussed previously herein. Using trimming logic, the control input N sets the free-running frequency of the VCO 20. The free-running frequency of the VCO 20 is the output frequency $F_{VCO}$ when the input control voltage $V_{CTRL}$ is equal to 0.

According to embodiments of the invention, the VCO arrangement shown in FIG. 2 provides a VCO that includes a gain $K_{VCO}$ that is proportional to its output frequency $F_{VCO}$. In general, the inventive VCO arrangement couples the control current $I_{GM}$ into the current scaling block 28, thus allowing the control current $I_{GM}$ to be scaled by the same scaling factor as the reference current $I_{FIXED}$ was scaled to set the free-running frequency. In this manner, the bias current $I_{CELL}$ of the local oscillator 29 is such that it causes the gain of the VCO 20 to be proportional to the output frequency of the local oscillator 29, which also is the VCO output or operating frequency $F_{VCO}$. Given the VCO arrangement shown in FIG. 2, the following discussion and corresponding equations will show that the gain $K_{VCO}$ of the VCO 20 is proportional to the VCO output or operating frequency $F_{VCO}$.

For the VCO 20 shown in FIG. 2, the gain $K_{VCO}$ of the VCO 20 is defined as:

$$K_{VCO} \equiv \frac{dF_{VCO}}{dV_{CTRL}} = AG_M \frac{dF_{VCO}}{dI_{CELL}}$$

However, as discussed previously herein, for a ring oscillator, the output frequency of the oscillator ($F_{VCO}$, in this case) is proportional to the transconductance of the oscillator divided by the effective capacitance of the oscillator, which is equal to the square root of $2KI_{CELL}$ divided by the effective capacitance of the oscillator. Thus:

$$\frac{dF_{VCO}}{dI_{CELL}} = \frac{1}{2C}\sqrt{\frac{2K}{I_{CELL}}} = \frac{F_{VCO}}{2I_{CELL}}$$

If the control current $I_{GM}$ is much less than the reference current $I_{FIXED}$ supplied by the reference current source 24 (i.e., if $I_{GM} \ll I_{FIXED}$), then:

$$\frac{dF_{VCO}}{dI_{CELL}} = \frac{F_{VCO}}{2I_{CELL}} \approx \frac{F_{VCO}}{2AI_{FIXED}}$$

Therefore:

$$K_{VCO} = AG_M \frac{dF_{VCO}}{dI_{CELL}} = AG_M \frac{F_{VCO}}{2AI_{FIXED}} = \left(\frac{G_M}{2I_{FIXED}}\right) F_{VCO}$$

Since $G_M$ and $I_{FIXED}$ are constants, it can be seen that $K_{VCO}$, the gain of the VCO 20, is proportional to $F_{VCO}$, the output frequency of the VCO 20. That is:

$$K \propto F_{VCO}$$

For example, if $G_M/I_{FIXED}=0.02$ V$^{-1}$, then the gain $K_{VCO}=10,000$ ppm/V, independent of $F_{VCO}$.

It should be understood that oscillators and oscillator circuitry according to embodiments of the invention are suitable for use with other oscillator circuitry arrangements and configurations. For example, embodiments of the invention include oscillators and oscillator circuitry with autotrim logic.

Figure 3:
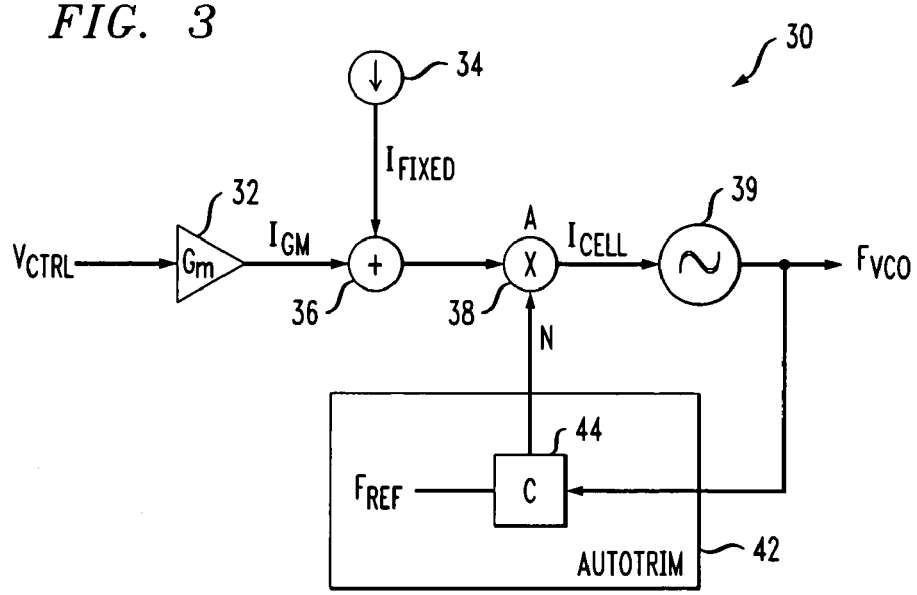
FIG. 3 is a simplified schematic diagram of a voltage-controlled oscillator circuit according to alternative embodiments of the invention.

Referring now to FIG. 3, shown is a voltage-controlled oscillator (VCO) 30 according to an alternative embodiment of the invention. Similar to the VCO 20 shown in FIG. 2, the VCO 30 in this alternative embodiment includes a voltage to current (V/I) converter 32, a reference current source 34, a summing node 36, a current scaling block 38, and a local oscillator 39. However, in this alternative embodiment of the invention, the VCO 30 also includes autotrim logic (shown generally as 42). The autotrim logic 42 includes, among other circuitry, a comparator 44 that compares the VCO output frequency $F_{VCO}$ to a reference frequency within the autotrim logic 42, $F_{REF}$.

During a power-up or reset of the VCO 30, or during a production test of the VCO 30, the free-run frequency of the VCO 30 is trimmed using the autotrim logic 42 to compensate for process variations. As discussed previously herein, the VCO free-run frequency is the output frequency of the VCO when the input control voltage $V_{CTRL}$ is 0. The autotrim logic 42 adjusts the coarse frequency control N of the current scaling block 38 in such a way that the VCO output frequency $F_{VCO}$, or a divided multiple thereof, is as close as possible to the reference frequency $F_{REF}$.

It will be apparent to those skilled in the art that many changes and substitutions can be made to the embodiments of the invention herein described without departing from the spirit and scope of the invention as defined by the appended claims and their full scope of equivalents.

The invention claimed is:

1. An oscillator circuit, the circuit comprising:
a voltage-controlled oscillator (VCO) having an output frequency $F_{VCO}$ and a gain $K_{VCO}$ that is proportional to the output frequency $F_{VCO}$;
a current scaling block for generating a VCO bias current $I_{CELL}$ that is input to the VCO, the current scaling block having a scaling factor A; and
a summing node for coupling a VCO control current $I_{GM}$ and a VCO reference current $I_{FIXED}$ into the current scaling block, wherein the current scaling block scales the sum of the VCO control current $I_{GM}$ and a VCO reference current $I_{FIXED}$ by the scaling factor A to generate the VCO bias current $I_{CELL}$, wherein the output frequency $F_{VCO}$ is based on the VCO bias current $I_{CELL}$.

2. The circuit as recited in claim 1, wherein the current scaling block is controlled by a control input N that provides coarse frequency tuning to the current scaling block.

3. The circuit as recited in claim 1, wherein the VCO has a plurality of VCO operating curves, and wherein the current scaling block further comprises trimming logic for selecting an appropriate VCO operating curve based on a reference frequency within the autotrim logic.

4. The circuit as recited in claim 1, wherein the oscillator circuit further comprises a reference current source for generating the VCO reference current $I_{FIXED}$.

5. The circuit as recited in claim 1, wherein the oscillator circuit further comprises a voltage to current (V/I) converter for generating the VCO control current $I_{GM}$.

6. The circuit as recited in claim 1, wherein the current scaling block is programmable.

7. The circuit as recited in claim 1, wherein the oscillator circuit is an integrated circuit.

8. The circuit as recited in claim 1, wherein the VCO is an integrated circuit.

9. The circuit as recited in claim 1, wherein the VCO is a ring oscillator.

10. An oscillator circuit, the circuit comprising:
a voltage-controlled oscillator (VCO) having an output frequency $F_{VCO}$ and a gain $K_{VCO}$ that is proportional to the output frequency $F_{VCO}$;
a current scaling block for generating a VCO bias current $I_{CELL}$ that is input to the VCO, the current scaling block having a scaling factor A;
a reference current source for generating a VCO reference current $I_{FIXED}$;
a voltage to current (V/I) converter for converting a control voltage $V_{CTRL}$ into a VCO control current $I_{GM}$; and
a summing node for coupling the VCO control current $I_{GM}$ and the VCO reference current $I_{FIXED}$ into the current scaling block in such a way that the VCO control current $I_{GM}$ is scaled by the same scaling factor as the VCO reference current $I_{FIXED}$, wherein the VCO bias current $I_{CELL}$ is the sum of the VCO reference current $I_{FIXED}$ scaled by the scaling factor A and the VCO control current $I_{GM}$ scaled by the scaling factor A, wherein the output frequency $F_{VCO}$ is based on the VCO bias current $I_{CELL}$.

11. The circuit as recited in claim 10, wherein the current scaling block is controlled by a control input N that provides coarse frequency tuning to the current scaling block.

12. The circuit as recited in claim 10, wherein the current scaling block is programmable.

13. The circuit as recited in claim 10, wherein the VCO has a plurality of VCO operating curves, and wherein the current scaling block further comprises trimming logic for selecting an appropriate VCO operating curve based on a reference frequency within the autotrim logic.

14. The circuit as recited in claim 10, wherein the VCO is an integrated circuit.

15. The circuit as recited in claim 10, wherein the VCO is a ring oscillator.

16. A phase-locked loop (PLL) circuit, comprising:
a phase/frequency detector (PFD);
a filter coupled to the output of the PFD; and
a voltage-controlled oscillator (VCO) coupled to the filter and the output of the PFD in such a way that a feedback path exists between the VCO and the PFD, the VCO generating an output frequency $F_{VCO}$ that is proportional to a VCO input voltage $V_{LF}$ provided by the filter, wherein the VCO has a gain $K_{VCO}$ that is proportional to the output frequency $F_{VCO}$, and wherein the VCO includes circuitry that couples a VCO control current $I_{GM}$ and a VCO reference current $I_{FIXED}$ and scales the sum of the coupled currents to form a bias current $I_{CELL}$ that adjusts the output frequency $F_{VCO}$ of the VCO.

17. The circuit as recited in claim 16, wherein the VCO includes a current scaling block for generating the VCO bias current $I_{CELL}$, the current scaling block having a scaling factor A.

18. The circuit as recited in claim 17, wherein the current scaling block is programmable.

19. The circuit as recited in claim 16, wherein the VCO includes a summing node for coupling the VCO control current $I_{GM}$ and the reference current $I_{FIXED}$.

20. The circuit as recited in claim 16, wherein the VCO includes a reference current source for generating the VCO reference current $I_{FIXED}$.

21. The circuit as recited in claim 16, wherein the VCO includes a voltage to current (V/I) converter for generating the VCO control current $I_{GM}$.

22. The circuit as recited in claim 16, wherein the VCO includes a plurality of operating curves, and wherein the PLL further comprises autotrim logic coupled to the VCO, the autotrim logic configured to select a VCO operating curve based on a reference frequency within the autotrim logic.

23. The circuit as recited in claim 16, wherein the PLL is an integrated circuit.

24. The circuit as recited in claim 16, wherein the VCO is a ring oscillator.

* * * * *